US006797636B2

(12) United States Patent
Tews et al.

(10) Patent No.: US 6,797,636 B2
(45) Date of Patent: Sep. 28, 2004

(54) PROCESS OF FABRICATING DRAM CELLS WITH COLLAR ISOLATION LAYERS

(75) Inventors: Helmut Horst Tews, Munich (DE); Rolf Weis, Wappinger Falls, NY (US)

(73) Assignee: Infineon Technologies AG, Munich (DE)

( * ) Notice: Subject to any disclaimer, the term of this patent is extended or adjusted under 35 U.S.C. 154(b) by 77 days.

(21) Appl. No.: 10/157,870

(22) Filed: May 31, 2002

(65) Prior Publication Data

US 2003/0224605 A1 Dec. 4, 2003

(51) Int. Cl.⁷ .............................................. H01L 21/302
(52) U.S. Cl. ...................... 438/706; 438/700; 438/710; 438/712; 438/720; 216/58
(58) Field of Search ................................. 438/700, 706, 438/712, 720, 246, 392, 393, 396, 710; 216/58, 67

(56) References Cited

U.S. PATENT DOCUMENTS

| | | | |
|---|---|---|---|
| 4,649,625 A | | 3/1987 | Lu |
| 5,395,786 A | | 3/1995 | Hsu et al. |
| 5,656,535 A | | 8/1997 | Ho et al. ................. 428/386 |
| 5,658,816 A | | 8/1997 | Rajeevakumar |
| 5,692,281 A | | 12/1997 | Rajeevakumar |
| 5,844,266 A | * | 12/1998 | Stengl et al. ............. 257/301 |
| 6,008,103 A | | 12/1999 | Hoepfner ................. 438/386 |
| 6,025,245 A | | 2/2000 | Wei ........................... 438/386 |
| 6,159,874 A | | 12/2000 | Tews ........................... 438/386 |
| 6,194,755 B1 | | 2/2001 | Gambino et al. |
| 6,297,089 B1 | * | 10/2001 | Coronel et al. ............. 438/246 |
| 6,326,261 B1 | * | 12/2001 | Tsang et al. ............... 438/243 |
| 6,333,532 B1 | * | 12/2001 | Davari et al. ............... 257/301 |
| 6,365,485 B1 | * | 4/2002 | Shiao et al. ................ 438/392 |

* cited by examiner

Primary Examiner—Lan Vinh
(74) Attorney, Agent, or Firm—Slater & Matsil, L.L.P.

(57) ABSTRACT

A process of preparing DRAM cells with collar isolation layers that isolate the trench top with vertical cell and active area from the buried plate to eliminate the space normally required by a final collar, comprising:

a) etching a deep trench (DT) in a substrate over which a patterned pad stack serving as a mask is positioned;

b) depositing a silicon nitride sacrificial collar liner in a top art of the trench;

c) etching below the sacrificial collar to form a bottle structure in a lower part of the trench;

d) forming an oxide layer, a nitride layer over the oxide layer, depositing a resist fill, and affecting a recess of the resist fill to a recess depth below the top of the bottle formation;

e) affecting a nitride etch followed by a resist strip f) affecting thermal oxidation using the nitride layer as a mask to form a closed layer of oxide at the top of the trench bottle shaped structure;

g) affecting a nitride strip; and h) forming a buried plate by gas phase doping to cause isolation between the active area and the buried plate.

22 Claims, 7 Drawing Sheets

PROCESS OF FABRICATING DRAM CELLS WITH COLLAR ISOLATION LAYERS

BACKGROUND OF THE INVENTION

1. Field of the Invention

The invention relates to a process flow for preparing DRAM cells with collar isolation layers for about 45 degrees rotated trench cells with narrow spaces between bottles, thereby avoiding the space required by a final collar (that may include collar RIE processing). More particularly, the invention process includes etching a trench, forming a sacrificial collar to make a thin nitride layer in the top part of the trench, and etching the bottle shape formation in the trench.

2. Description of the Prior Art

U.S. Pat. No. 6,326,261 disclose a method of fabricating a deep trench capacitor. After several process steps, including formation of a deep trench 38, a silicon nitride layer 40 is deposited on the substrate 32. Subsequently, a photoresist layer 42 fills in the deep trench 38, with the surface of the photoresist layer 42 aligned with the tops of the deep trench 38. Therein, the silicon nitride layer 40 uniformly covers both the surfaces of the pad stack 34 and the deep trench 38. Following the baking of the photoresist solution, an oxygen plasma is used to etch back the baked photoresist to form a photoresist layer 42 of an appropriate thickness. A wet etching is performed, to remove the silicon nitride layer 40 not covered by the photoresist layer 42 and to expose the substrate 32 in the upper region of the deep trench 38. After the removal of the photoresist layer 42, a high-temperature oxidation process, such as a rapid thermal process operated under a moist environment, is performed to simultaneously grow a first oxide film (not shown) on the surface of the silicon nitride layer 40 and a second oxide film on the exposed substrate 32 in the upper region 43 of the deep trench 38. The second oxide film, also called a collar oxide 46, is formed to reduce parasitic leakage from the deep trench 38. (FIGS. 8–10; col. 3, line 40, col. 4, line 9).

A low-resistance salicide fill for trench capacitors is disclosed in U.S. Pat. No. 6,194,755. FIG. 1(a) shows a cross-sectional view of an initial bottle-shaped trench structure 10. Narrow upper region 16a preferably contains an oxide collar 22 which may be formed by local oxidation of silicon (LOCOS) (col. 3, lines 18–20).

U.S. Pat. No. 6,025,245 disclose a method of forming a trench capacitor with a sacrificial silicon nitrate sidewall. A silicon nitride layer 202 is formed on the silicon substrate 201. A thick oxide layer 203 is then formed and patterned on the silicon nitride layer 202 to define a deep trench region. The thick oxide layer 203 is then removed. A tetraethyl-orthosilicate (TEOS) oxide layer 204 is formed in the deep trench region 200 and on the silicon nitride layer 202. The TEOS oxide layer 204 is recess etched. In this etching, a portion of silicon substrate 201 is exposed in the deep trench region 200 to form a trench sidewall. A thermal oxidation is performed to form a collar oxide 205 on the exposed silicon substrate 201. (FIGS. 2–4; col. 3, lines 5–46).

A method of forming a hemispherical grained capacitor is disclosed in U.S. Pat. No. 6,159,874. After several process steps, including formation of a trench 22, a thin silicon dioxide layer 24 is next grown on walls 23 of trench 22 to passivate and protect walls 23. Next, a silicon nitride layer 26 is deposited over silicon dioxide layer 24, and etched using conventional photolithographic chemical etching techniques such that silicon nitride layer 26 covers only a lower portion 28 of trench 22. An upper portion 30 of trench 22 remains uncovered by silicon nitride layer 26. A localized oxidation of silicon (LOCOS) collar 32 is next formed in upper portion 30 of trench 22 by a conventional LOCOS process, here thermal oxidation of silicon substrate 10 surrounding upper portion 30 of trench 22. (FIGS. 2C–2E; col. 3, lines 29–48).

U.S. Pat. No. 5,656,535 disclose a storage node process for deep trench-based DRAMS. After several process steps, including formation of a trench 18. A node reoxidation process oxidizes the node dielectric 20 remaining in the deep trench 18 and grows a collar oxide 24. The node reoxidation process uses a thermal wet oxidation to grow the collar oxide 24 along the deep trench sidewall 19 to a thickness of approximately 50 nm. (FIGS. 4 and 5; col. 3, lines 37–45).

A method for forming trench capacitors in an integrated circuit is disclosed in U.S. Pat. No. 6,008,103. After the trench is etched, the trench interior is coated with a suitable liner layer 704 (e.g., a nitride layer). The liner layer is etched back using a photoresist plug process so that the remaining nitride liner at least covers the region within the trench where the buried plate will eventually be formed. A suitable photoresist plug process to facilitate the liner etch may involve filling the trench with photoresist (706 in FIG. 7A) and then etching the photoresist back within the trench to about the level of the top of the future buried plate to form a photoresist plug therein (706A in FIG. 7B). Thereafter, a liner etch process is performed to remove the liner material within the trench that is not covered by the photoresist plug. The liner material that is protected by the photoresist plug at the bottom of the trench remains substantially unattacked during the liner etch process. The unetched liner layer is shown in FIG. 7B as liner layer 704A. Thereafter, the photoresist plug itself may be removed, leaving behind a liner coating that covers the portion of the trench interior up to the level of the (now removed) photoresist plug. The silicon region in the trench where the collar is to be formed (region 710 FIG. 7B) is not covered by the liner material. Accordingly, the silicon material in region 710 of FIG. 7B is subsequently oxidized in an oxidization step to form the oxide collar (using, for example, either a wet or dry oxidation process). (FIGS. 7A–7C; col. 5, line 12-col. 6, line 41).

There is a need in the art of forming DRAM cells, in which a metal oxide semiconductor (MOS) transistor is connected to a capacitor to devise a process scheme that isolates the top trench with vertical cell and active area from the buried plate without requiring an additional collar, so that, in the top trench, the trench diameter is equal to the design measure, thereby allowing for maximum silicon thickness in the active area and for improved body contact, and so that, due to the absence of a final collar layer, the trench can be filled with maximum thickness of trench fill, e.g. poly silicon.

SUMMARY OF THE INVENTION

It is therefore an objective of the present invention to provide a process flow for DRAM cells that isolates the top trench with vertical cell and active area from the buried plate, so that no additional collar is required, and so that, in the trench top, the trench diameter is equal to the design measure, thereby allowing for maximum silicon thickness in the active area and for improved body contact, and so that, due to the absence of a final collar layer, the trench can be filled with the maximum thickness of trench fill, e.g. poly silicon, and to allow resistance of the trench fill to be optimized.

In a preferred embodiment, the present invention process provides a process flow from DRAM cells with collar isolation layers by:

a) etching a deep trench (DT) in a substrate over which a patterned pad stack is positioned, said patterned pad stack serving as a mask;

b) depositing a silicon nitride sacrificial collar layer or liner in a top part of the trench;

c) affecting an etch below the sacrificial collar to form a bottle-shaped structure in a lower part of the trench;

d) forming an oxide layer, forming a nitride layer over the oxide layer, depositing a resist fill, and affecting a recess of the resist fill so that the resist recess depth is below the top of the bottle formation;

e) affecting a nitride etch followed by a resist strip;

f) affecting a thermal oxidation using the nitride layer as a mask to form a closed layer of oxide at the top of the trench bottle-shaped structure;

g) affecting a nitride strip; and h) affecting a gas phase doping (GPD) to form a buried plate so that the closed layer causes isolation between the active area and the buried plate.

Alternatively, between steps e) and f) P well buried plate doping may be affected using gas phase doping.

BRIEF DESCRIPTION OF THE DRAWING FIGURES

FIG. 1 depicts a top view of a layout of trenches with 45 degrees rotated lithography printing, that creates maximum trench bottle sizes and equal spacings between neighboring trenches, where typical dimensions are 200–250 nm corner length and 50 nm spacing.

FIGS. 2–6 show cross-sectional schematic views and a top schematic layout of the DRAM cells at various stages in the fabrication process, wherein:

FIG. 2 shows a cross-sectional schematic view of the cell after etching a deep trench into a substrate, depositing a silicon nitride sacrificial collar layer in a top part of the trench, and affecting a bottle etch below the sacrificial collar;

FIG. 3 shows a cross-sectional schematic view of the cell from FIG. 2 after forming an oxide layer, forming a nitride layer over the oxide layer, depositing a resist fill and affecting a recess of the resist fill so that the resist recess depth is below the top of the bottle;

FIG. 4 shows a cross-sectional schematic view of the cell from FIG. 3 after subjecting the structure of FIG. 3 to a nitride etch followed by resist stripping;

FIG. 5 shows a cross-sectional schematic view of the cell from FIG. 4 after subjecting the cell of FIG. 4 to thermal oxidation, in which the nitride layer acts as a mask to form a closed layer of oxide at the top of the trench bottle, followed by a nitride strip and gas phase doping;

Figure 2:
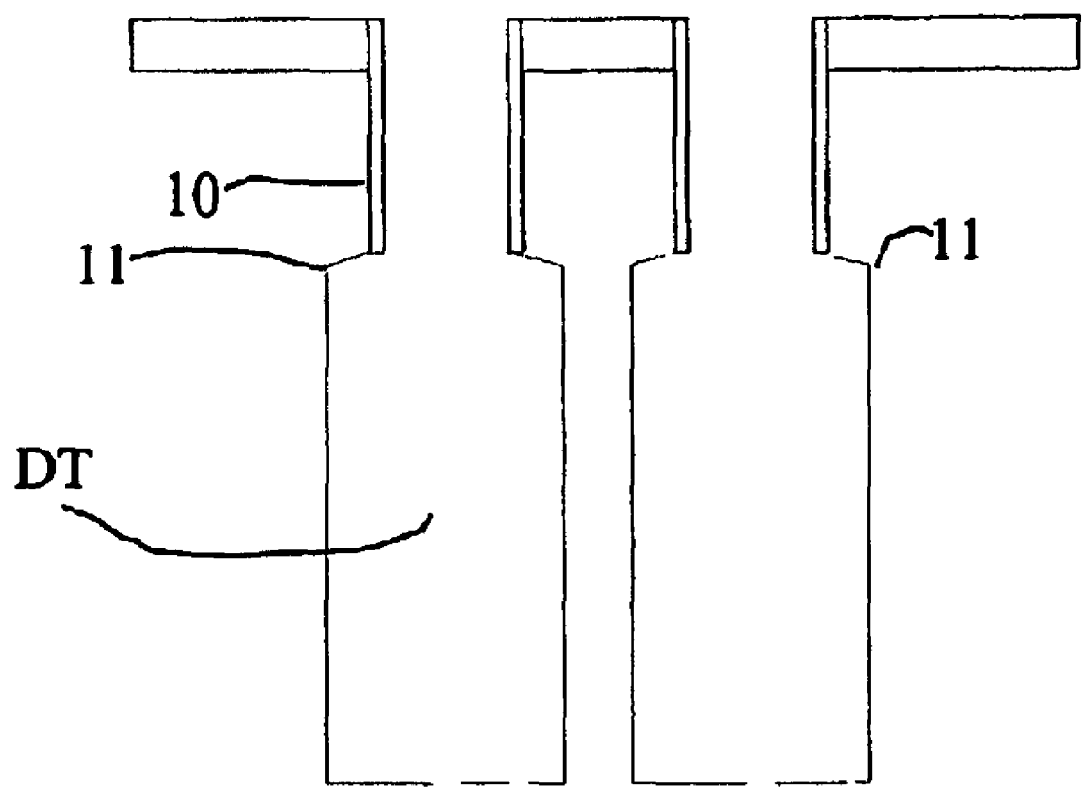
Figure 5:
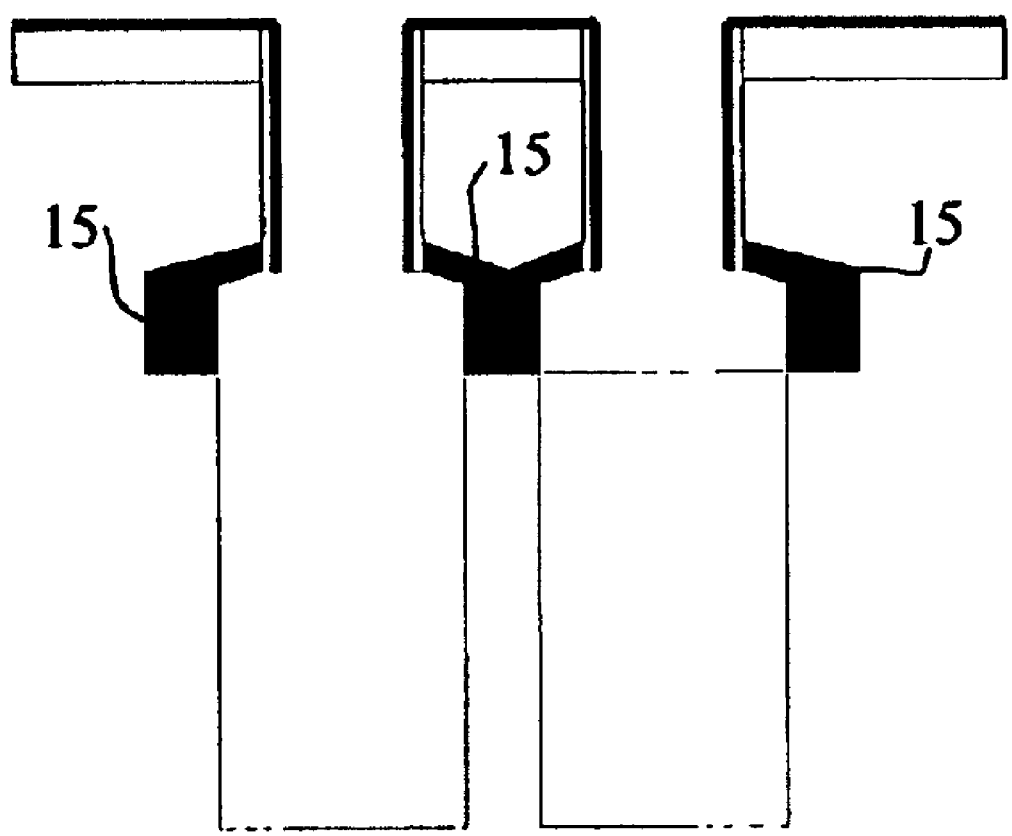
Figure 6:
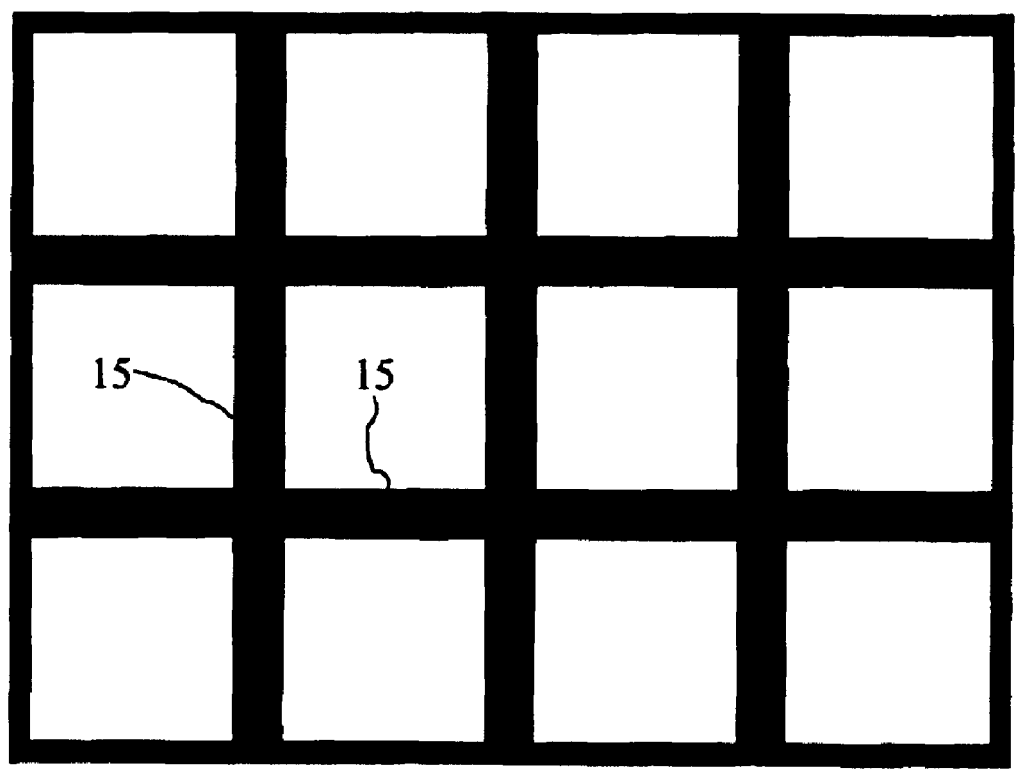
Figure 7:
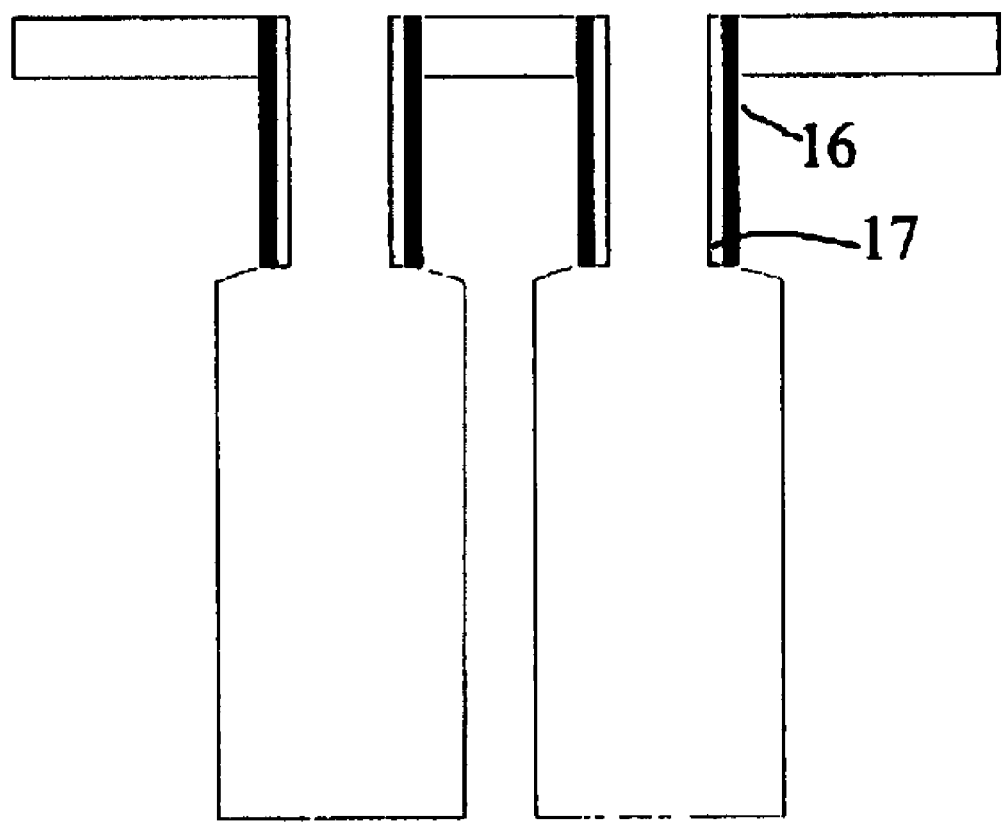

FIG. 6 is a top view of a schematic layout of the structure from FIG. 5, and shows the layer that causes isolation between the active area and the buried plate created by gas phase doping, to provide a nitride/oxide/node sequence in the top part of the trench below the buried strap; and FIG. 7 is a cross-sectional schematic view of an alternative embodiment processing sequence showing a cell wherein processing is started using an oxide/nitride layer after the sacrificial collar process of FIG. 2.

DETAILED DESCRIPTION OF PREFERRED EMBODIMENT OF THE INVENTION

In the context of the invention, a collar scheme is utilized to account for the shrinking design rules necessary in advanced trench DRAM technologies, and utilizes a thin sacrificial collar built-in after etching to form a trench. This sacrificial collar scheme allows subsequent processing steps such as etching to form a bottle structure and gas phase doping to provide a buried strap region. Further, the foregoing processing scheme for DRAM technologies also permits optimization of the trench poly fill.

Figure 1:
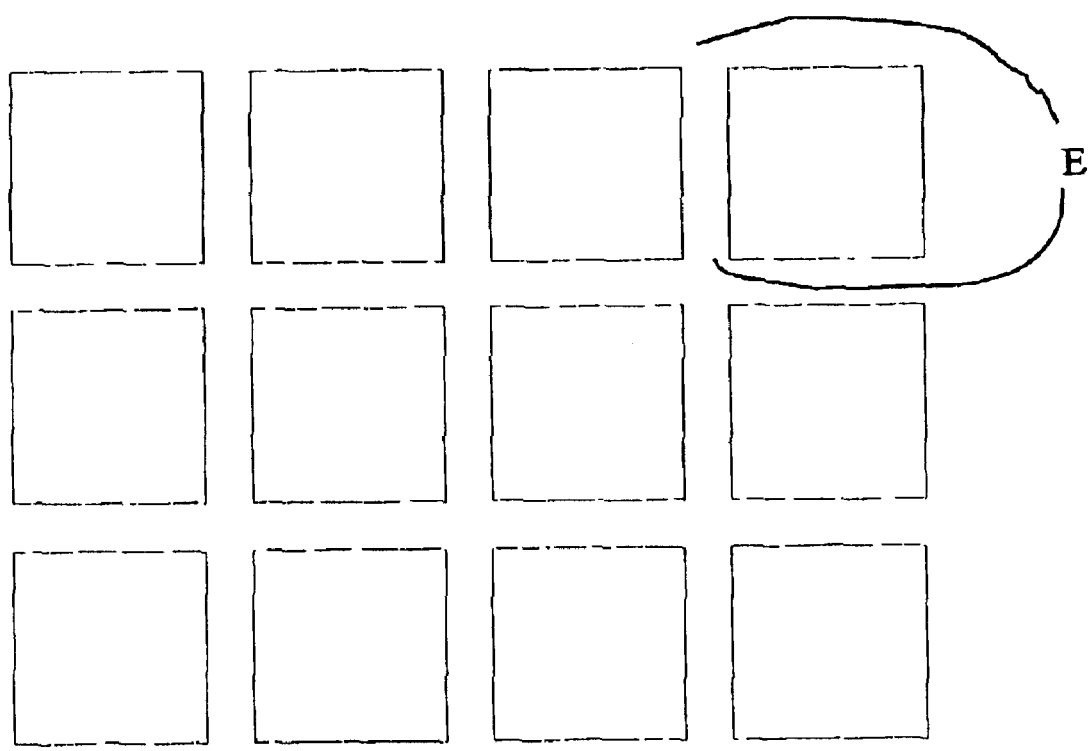

For example, as may be seen from FIG. 1, which depicts a top view of a layout of trenches with 45 degrees rotated lithography printing, there is created maximum trench bottle sizes with equal spacings between neighboring trenches. Typical dimensions are 200–250 nm corner lengths and 50 nm spacing. However, these numbers will of necessity be smaller with shrinking design rules when advancing trench DRAM technologies.

In the process flow for DRAM cells with collar isolation layers of the invention scheme, the process flow is premised around a collar isolation for 45 degrees rotated trench cells with narrower spaces between bottles, to avoid the space required by a final collar, including processing using collar reactive ion etching (RIE). In this connection, reference is made to FIG. 2 which shows a cross-sectional schematic view of the cell at the stage after etching a deep trench into a substrate, depositing a silicon nitride sacrificial collar layer in a top part of the trench, and affecting a bottle etch below the sacrificial collar. More particularly, a deep trench (DT) etch is formed in a substrate, followed by depositing a sacrificial collar of a thin nitride liner 10 in a top part of the trench. Next, a bottle shaped structure or bottle 11 is etched into a lower part of the trench, as can be seen from FIG. 2. The recess depth is chosen to account for several requirements; namely 300–400 nm for the vertical transistor and 300–500 nm for the body contact, thereby resulting in a total recess depth of about 0.8 $\mu$m.

Figure 3:
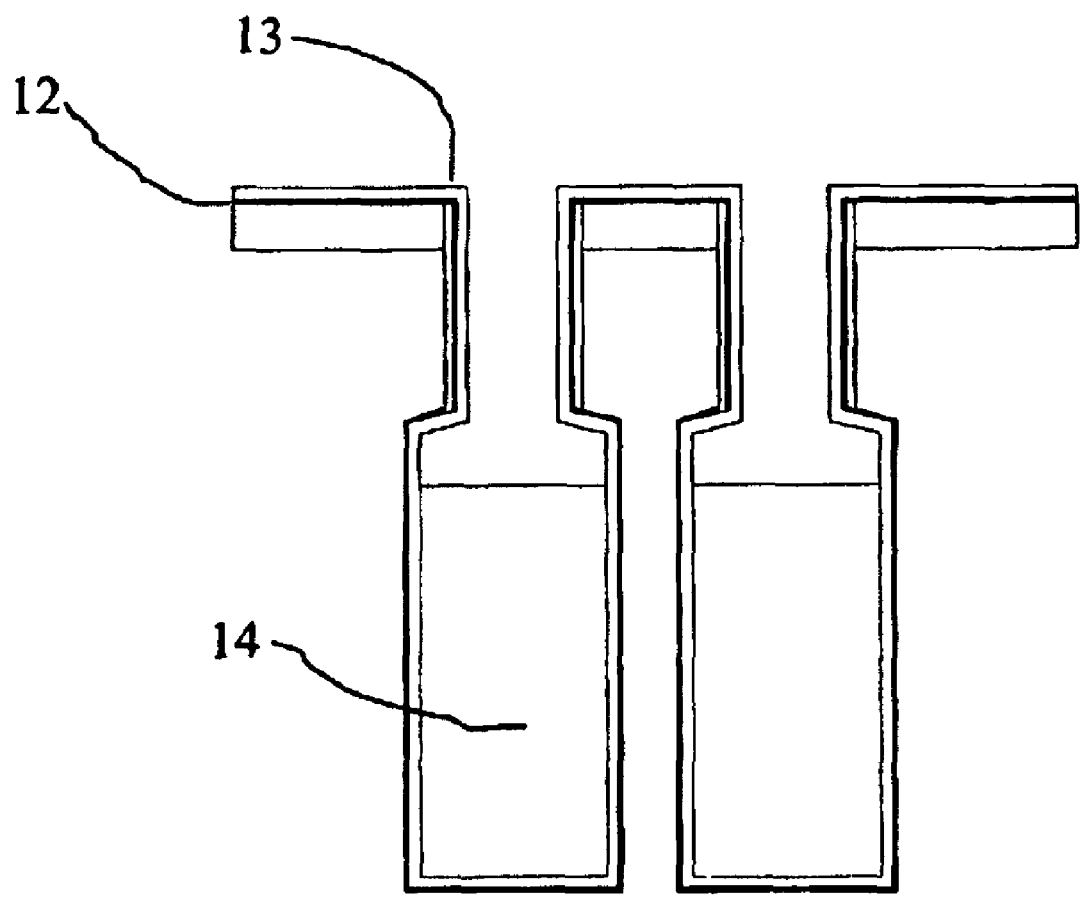
Figure 4:
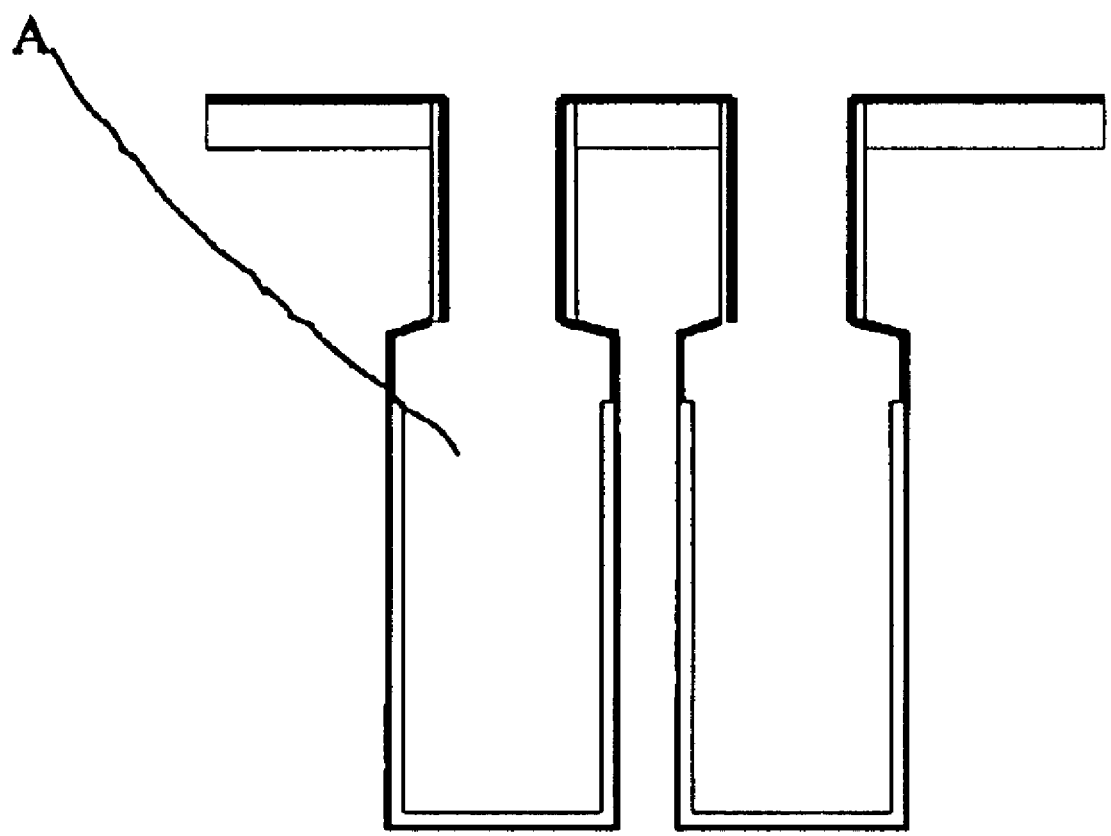

After the fabrication stage up through FIG. 2, a thin oxide layer 12 is formed over the nitride liner, followed by depositing a thin nitride layer 13 over oxide layer 12, whereupon a poly fill or resist fill 14 is deposited followed by etching to form a recess in the poly fill so that the resist recess depth is chosen to be below the top of the bottle, e.g., at a total depth of about 1 $\mu$m, as is shown in FIG. 3. A nitride etch is then performed, as is shown in FIG. 4, followed by stripping the resist fill to leave the area A below the top of the bottle, as shown in the cross-sectional schematic view of the cell of FIG. 4.

Following thermal oxidation with the nitride layer acting as a mask, oxidation is affected to create a closed layer of oxide 15 at the top of the trench bottle, as is shown in FIG. 5. The nitride layer acting as a mask is then subjected to a stripping step after which gas phase doping is utilized to provide a buried plate (not shown), which is conventional and known to a skilled worker in the art.

As may be seen from the top view of the schematic layout of the structure in FIG. 6, thermal oxidation creates a closed layer of oxide 15 that affects isolation between the active area (not shown) and the buried plate.

This scheme leaves a nitride/oxide/node layer sequence in the top part of the trench below the buried strap. As an alternative, the processing can be started using an oxide/nitride layer as shown in FIG. 7 after the sacrificial collar process (see FIG. 2). In that case, the layer stack between buried strap and collar isolation layer is oxide/nitride/oxide/node. This layer sequence has lower trap densities compared to the stack of layer nitride/oxide/node and appears advantageous with respect to buried strap/body leakage.

FIG. 7 is a cross-sectional schematic view of an alternative embodiment processing sequence showing a cell wherein processing is started using an oxide/nitride layer 16 and 17 respectively after the sacrificial collar process.

The advantages of the invention scheme are:

isolation of the trench top with vertical cell and active area from the buried plate;

no additional collar is required;

in the trench top, the trench diameter is equal to the design measure, allowing for maximum silicon thickness in the active area and for improved body contact;

due to the absence of a final collar layer, the trench can be filled with the maximum thickness of trench fill, e.g. poly silicon, and the resistance of the trench fill is also optimized;

absence of the final collar layer also means that no collar RIE step is required as in the case of a deposited collar; and the buried strap processing can also be simplified since no collar needs to be etched.

While the invention has been described in particular with respect to preferred embodiments, it is to be understood by those skilled in the art that modifications to the disclosed embodiments can be made without departing from the spirit and scope of the invention.

We claim:

1. A process of preparing DRAM cells with collar isolation layers that isolate the trench top with vertical cell and active area from the buried plate to eliminate the space normally required by a final collar, comprising:

a) etching a deep trench (DT) in a substrate over which a patterned pad stack is positioned, said patterned stack serving as a mask;

b) depositing a silicon nitride sacrificial collar layer or liner in a top part of the trench;

c) affecting an etch below the sacrificial collar to form a bottle-shaped structure in a lower part of the trench;

d) forming an oxide layer along sidewalls of the deep trench, forming a nitride layer over the oxide layer, depositing a resist fill, and affecting a recess of the resist fill so that the resist recess depth is below the top of the bottle formation;

e) affecting a nitride etch followed by a resist strip;

f) affecting a thermal oxidation using the nitride layer as a mask to form a closed layer of oxide at the top of the trench bottle-shaped structure;

g) affecting a nitride strip; and h) affecting a gas phase doping (GPD) to form a buried plate so that the closed layer causes isolation between the active area and the buried plate.

2. The process of claim 1 wherein, between steps e) and f) P well buried plate doping is affected using gas phase doping.

3. The process of claim 1 wherein said substrate is selected from the group consisting of silicon, a silicon-on-insulator (SOI) or an epitaxy substrate.

4. The process of claim 3 wherein the substrate is silicon.

5. The process of claim 4 wherein in step d) the recess depth is chosen to obtain a vertical transistor of between about 300 to about 400 nm and a body contact of about 300 to about 500 nm.

6. The process of claim 5 wherein said recess depth is a total depth of about 1 µm.

7. The process of claim 6 wherein said resist fill is polysilicon.

8. The process of claim 3 wherein the substrate is a silicon-on-insulator (SOI) substrate.

9. The process of claim 8 wherein in step d) the recess depth is chosen to obtain a vertical transistor of between about 300 to about 400 nm and a body contact of about 300 to about 500 nm.

10. The process of claim 9 wherein said recess depth is a total depth of about 1 µm.

11. The process of claim 10 wherein said resist fill is polysilicon.

12. The process of claim 3 wherein the substrate is an epitaxy substrate.

13. The process of claim 12 wherein in step d) the recess depth is chosen to obtain a vertical transistor of between about 300 to about 400 nm and a body contact of about 300 to about 500 nm.

14. The process of claim 13 wherein said recess depth is a total depth of about 1 µm.

15. The process of claim 14 wherein said resist fill is polysilicon.

16. A method of preparing a capacitor, the method comprising:

forming deep trenches in a substrate, each deep trench having sidewalls and having a neck portion and a bottom portion;

forming a first oxide mask along the sidewalls of the deep trench;

forming a first nitride mask on the first oxide mask;

partially filling the deep trench with a first material, a top of the first material being below a top of the bottom portion, thereby leaving an exposed portion of the nitride layer along the neck portion and the top of the bottom portion;

removing the exposed portion of the nitride layer, thereby exposing an exposed portion of the oxide layer; and oxidizing such that portions of the substrate located between deep trenches become oxidized.

17. The method of claim 16 wherein P well buried plate doping is performed prior to the step of oxidizing.

18. The method of claim 16 wherein the substrate is selected from the group consisting of silicon, a silicon-on-insulator (SOI) or an epitaxy substrate.

19. The method of claim 16 wherein the step of partially filling is performed such that a vertical transistor of between about 300 to about 400 nm and a body contact of about 300 to about 500 nm is formed.

20. The method of claim 16 wherein the step of partially filling is performed such that a recess depth of about 1 µm is formed.

21. The method of claim 16 wherein the first materiel is polysilicon.

22. The method of claim 16 wherein the step of partially filling is performed by depositing a resist fill and affecting a recess of the resist fill so that a depth of the recess is below the neck portion.

* * * * *